United States Patent [19]

Perna et al.

[11] Patent Number: 4,833,697

[45] Date of Patent: May 23, 1989

[54] WRITING INSTRUMENT FOR ELECTRONIC COUNTING AND GRAVITY SWITCH RESET

[75] Inventors: Fred P. Perna, 1417 W. Park, Anaconda, Mont. 59711; Stuart R. Peterson, Minnetonka, Minn.

[73] Assignee: Fred P. Perna, Anaconda, Mont.

[21] Appl. No.: 104,238

[22] Filed: Oct. 5, 1987

Related U.S. Application Data

[63] Continuation of Ser. No. 920,713, Oct. 20, 1986, Pat. No. 4,726,044.

[51] Int. Cl.⁴ ...................... H03K 21/18; H03K 21/38; G06M 11/00

[52] U.S. Cl. .......................................... 377/15; 377/6; 377/53; 377/112; 377/107; 136/291; 368/205; 250/206

[58] Field of Search ....................... 377/15, 6, 53, 112, 377/107; 368/205; 136/291; 250/206

[56] References Cited

U.S. PATENT DOCUMENTS

| | | | |
|---|---|---|---|
| 3,064,888 | 11/1962 | Van De Mark | 235/64 |
| 3,254,836 | 6/1966 | Corpian | 235/64 |
| 3,617,708 | 11/1971 | Bongiovanni | 235/64 |
| 3,630,015 | 12/1971 | Lehovec | 136/291 |
| 4,295,038 | 10/1981 | Kreinbrink et al. | 377/6 |
| 4,409,538 | 10/1983 | Tabata | 368/205 |
| 4,726,044 | 2/1988 | Perna et al. | 377/15 |

FOREIGN PATENT DOCUMENTS

| | | | |
|---|---|---|---|
| 2542831 | 4/1977 | Fed. Rep. of Germany | 377/15 |
| 0058590 | 4/1984 | Japan | 377/15 |

*Primary Examiner*—John S. Heyman

*Attorney, Agent, or Firm*—Peterson, Wicks, Nemer & Kamrath

[57] ABSTRACT

A ballpoint pen of conventional size and shape has a movable ball point that is pressed upwardly in the direction of the housing of the pen when a mark is made. Means is provided for normally biasing the ballpoint outwardly of the housing. However, when the ballpoint is pressed against a writing surface, the refill cartridge having the ball at the lower end thereof is moved upwardly to close a normally open switch which connects a solar cell array in circuit with an electronic counter that counts each time the switch is closed. Controlled by the counter is a liquid crystal display that visually indicates the total number of counts. A gravity switch is contained in the housing and is actuated to reset or clear the counter in preparation for counting a succeeding group of marks when the pen is inverted.

5 Claims, 2 Drawing Sheets

WRITING INSTRUMENT FOR ELECTRONIC COUNTING AND GRAVITY SWITCH RESET

CROSS-REFERENCE TO RELATED APPLICATION

This is a continuation of Ser. No. 920,713 filed Oct. 20, 1986 for "Writing Instrument With Solar-Powered Electronic Counting and Liquid Crystal Display" now Pat. No. 4,726,044.

BACKGROUND OF THE INVENTION

1. Field of the Invention

This invention relates generally to writing instruments capable of electronically counting the number of marking strokes, and pertains more particularly to a ballpoint pen in which the counting circuitry is reset by means of a gravity switch contained within the pen.

2. Description of the Prior Art

Writing instruments capable of counting the number of marks are not completely new. Examples of such devices are disclosed in U.S. Pat. No. 3,064,888, issued to Robert L. Van De Mark on Nov. 20, 1962 for "COUNTING PEN" and West German Pat. No. 2,542,831, issued to Plath et al on Apr. 7, 1977 for "BALL PEN WITH INTERNAL ELECTRONIC COUNTER." Insofar as we are aware, the alluded to patented devices are capable of performing their intended counting function. However, the pens are quite bulky, cumbersome, relatively costly and sufficiently complex so as to militate against any general use and adoption of such instruments. The German patent discloses a larger than normal ballpoint pen containing a battery-powered internal electronic calculator having an external on-off switch and an external reset button. The German pen lacks an internally disposed gravity switch for resetting the calculator. The counting marker disclosed in said U.S. patent utilizes both an external counting mechanism and an external battery. Hence, again there is no gravitational reset feature.

SUMMARY OF THE INVENTION

The invention has for an object the provision of a writing instrument with counting capabilities incorporated therein that will be aesthetically attractive. In this regard, an aim of the invention is to not only have the instrument resemble an ordinary ballpoint pen but also devoid of external buttons that would detract from its appearance.

The invention has for a further object the facile resetting or clearing of the numerical display by means of a gravity switch so that a succeeding group of counts can be quickly undertaken. The invention will possess especial utility in the grading of examination papers by teachers in that once one paper has been graded the teacher need only invert the instrument in order to reset the display in preparation for grading the next examination paper.

Briefly, our invention is embodied in a ballpoint pen having a movable ball that is urged upwardly toward the pen's housing whenever a mark is made on a writing medium. At the upper end of the reservoir or refill, the ball being at the lower end, is a normally open switch that is closed each time a marking stroke is made so that a solar cell array is electrically connected in circuit with an electronic counter that provides a binary coded decimal (BCD) output indicative of the total count or tally that is forwarded to a liquid crystal display so that the user is immediately apprised of the total count or tally in decimal form resulting from the number of marking strokes that the user has made on a writing medium, such as an examination paper that is being scored or graded. Our invention envisions an invertible gravity switch by means of which the counter can be quickly reset so that the display is completely cleared in preparation for counting a succeeding group of marks.

DESCRIPTION OF THE PREFERRED EMBODIMENT

Figure 1:
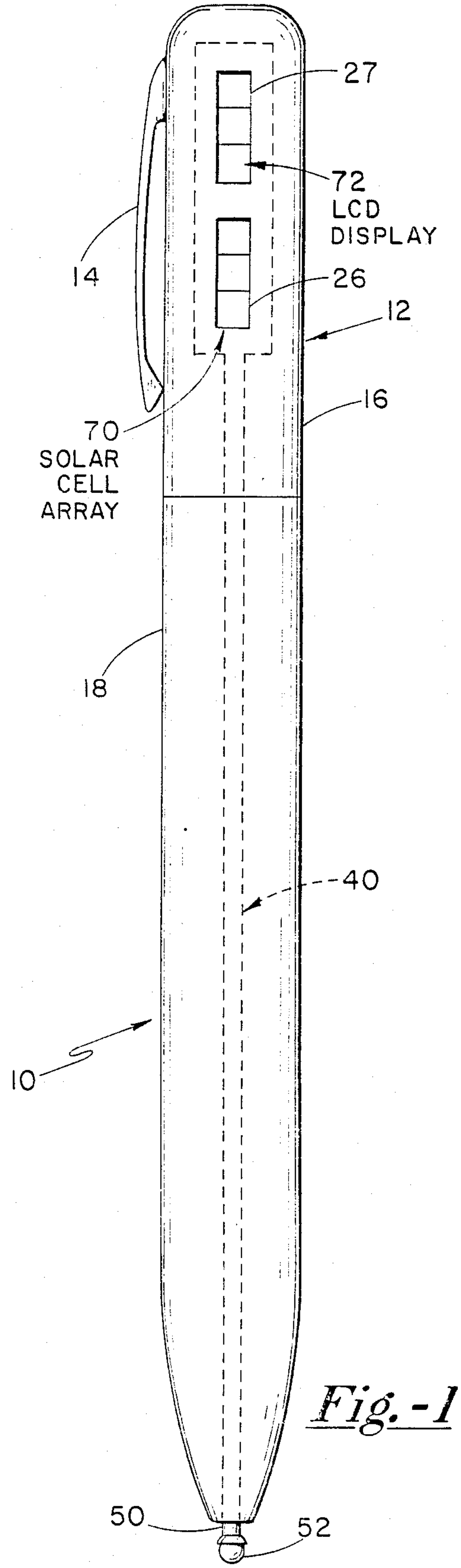
FIG. 1 is an elevational view of a ballpoint pen exemplifying our invention.

Although our invention could be embodied in a mechanical pencil, the ballpoint pen that incorporates therein our invention is denoted generally by the reference numeral 10 comprising a tubular housing or body 12 having a clip 14 at its upper end. As is typical with ballpoint pens, the pen 10 includes an upper plastic component and a lower plastic component 18.

Figure 2:
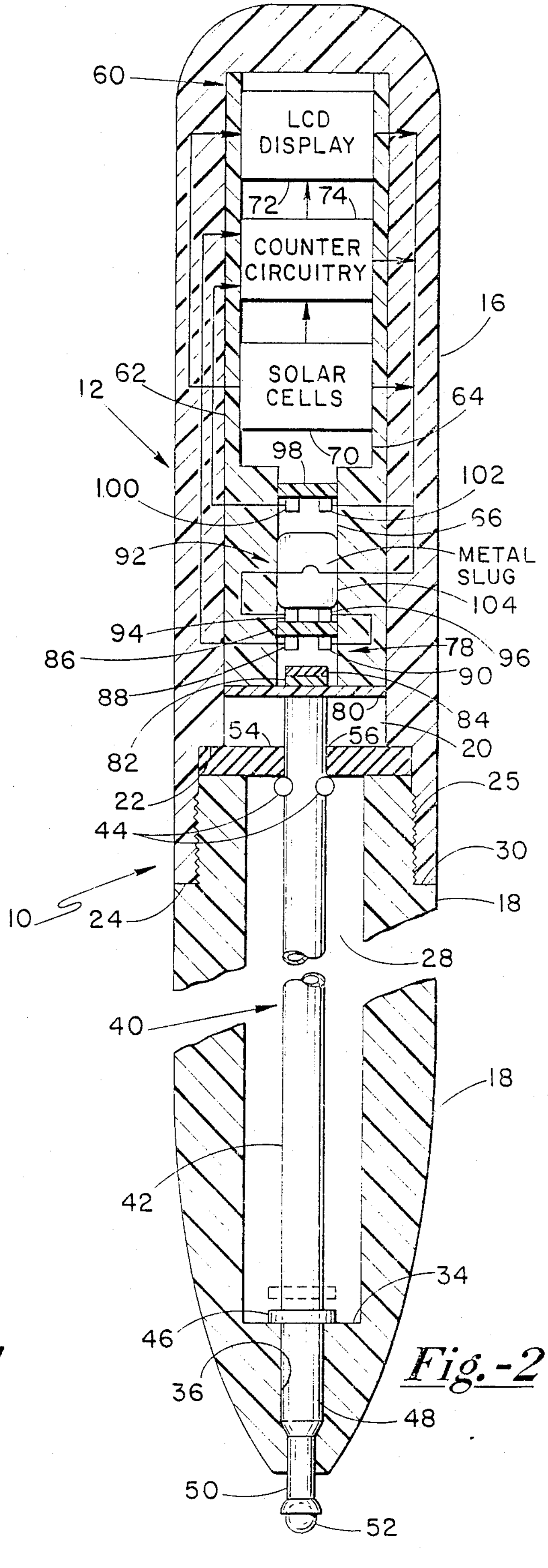
FIG. 2 is a vertical sectional view pictorially illustrating the internally housed components within the ballpoint pen.

Describing first the upper component 16, which has a closed top, it will be observed from FIG. 2 that it has a hollow interior or compartment 20 formed with an annular shoulder 22 insert from its bottom end 24. By means of internal threads 25, the two components 16 and 18 are detachably held together. For purposes later to be referred to, the upper component is formed with two rectangular windows 26 and 27.

As far as the lower component 18 is concerned, it has a hollow interior or compartment 28 provided with an outer annular shoulder 20 that abuts the bottom end 24 when the components 16 and 18 are threadably attached. The component 18 has an upper circular end 32 that does not abut or engage the shoulder 22 for a purpose hereinafter explained. The lower component 18 is formed so that an annular bottom 34 is provided at the lower end of the hollow interior or compartment 28. Further, there is a bore 36 of reduced cross section, the bore 36 leading to the lower end or writing tip of the pen 10.

Attention is now directed to a replaceable reservoir or refill cartridge indicated by the numeral 40 in which the writing ink is contained. More specifically, the reservoir or refill cartridge 40 includes an upper tube 42 of plastic, such as vinyl, having a pair of outwardly issuing ears or tabs 44, either molded or crimped thereon. Also, adjacent the lower end of the plastic tube 42 is an integral collar 46 that abuts or engages the annular bottom 34 of the hollow interior or compartment 28. The function of the collar 46 is to limit the downward movement of the plastic tube 42. The reservoir or refill cartridge 40 additionally includes a lower metal tube 48 that is fixedly connected to the plastic tube 42. The metal tube 48 has a somewhat constricted tip 50 that contains at its lower end a rolling ball 52 that applies ink from the reservoir 40 onto the surface to be marked.

In conventional ballpoint pens, the reservoir or refill cartridge 40 is normally urged upwardly by means of a coil spring and the upward bias is overcome by a pushbutton action to cause the ball to protrude from the pen's housing, the coil spring normally retracting the reservoir into the housing. However, in the present instance, just the reverse is planned. In this regard, a rubber washer 54 having a hole 56 therein encircles the upper portion of the plastic tube 42 of the reservoir or refill cartridge 40. The purpose of the rubber washer 54 is to urge or bias the entire cartridge 40 downwardly to cause the tip 50 and the ball 52 at the lower end thereof to protrude from the lower end of the component 18. This results in the previously mentioned collar 46 on the plastic tube 42 engaging the annular bottom labelled 34. This simply prevents the reservoir or refill cartridge 40 from being completely ejected. More specifically, it will be recognized that the rubber, or other elastomeric material, circumjacent the hole 56 acts or bears against the ears or tabs 44 to gently urge the reservoir or refill cartridge 40 downwardly.

An assembly which will be generally identified as a cylindrical unit 60 comprises an elongated plastic casing 62 having a bore 64 and a counterbore 66 formed therein. The unit 60 is press-fitted into the compartment 20. The upper end of the component 16, being closed, enables the unit 60 to be merely pressed upwardly into engagement with its upper end.

The cylindrical unit 60 contains therein a solar cell array 70 which can be seen through the previously mentioned window 26. Also contained in the unit 60 is a liquid crystal display 72 that can be viewed through the other window 27. Additionally, there is an electronic decade counter 74 comprised of three cascaded BCD stages or orders that will be referred to in greater detail hereinafter. Likewise, there is a combination decoder/driver unit 76. However, individual or separate decoders and drivers may be employed, if desired; the combining of the functions conserves drafting space, though. The decoder portion of the decoder/driver 76 converts the binary tally registered by the counter 74 to a corresponding 7-bit word for each stage and the 7-bit words are fed to the segment drivers of the driver portion of the decoder/driver 76, a procedure which will become more apparent when FIG. 3 is considered.

What will be termed a ballpoint switch 78 is also housed in the cylindrical unit 70. The ballpoint switch 78 is comprised of an elastomeric membrane or diaphragm 80, which can be rubber, having a dielectric disc 82 secured to its upper side, the disc 82 being of hard plastic. Carried on the upper surface of the disc 82 is an electrically conductive metal wafer 84. Although providing a dual function, it is to be noted that a second dielectric disc 86 of hard plastic is fixedly held in place within the bore 64, having a pair of electric contacts 88, 90 carried thereon. It can be pointed out at this stage that when the reservoir or refill cartridge 40 is forced upwardly, as it is when marking pressure is applied to the pen 10, the diaphragm 80, being an elastomeric material, is flexed or bowed upwardly so that the metal wafer 84 engages the contacts 88, 90 to complete a circuit to the counter 74. Here again, this action will be better understood when FIG. 3 is discussed.

Whereas the switch 78 has been termed a ballpoint switch, a second switch playing an important role in the practicing of our invention will be called an invertible gravity switch, being generally denoted by the reference numeral 92. It has been mentioned that the disc 86 performs a dual purpose. Thus, it should be noted that the upper side or face of the disc 86 carries a pair of fixed contacts 94, 96. The invertible gravity switch 92 further comprises a dielectric disc 98 of hard plastic that is fixedly positioned in a vertically spaced relationship with the previously mentioned disc 86. Carried on the underside of the disc 98 is a pair of contacts 100, 102. The contacts 94, 96 are bridged or normally closed by means of a shiftable metal slug or pellet 104. It can be seen that the contacts 100, 102 of the invertible gravity switch 92 are connected in series with the contacts 88, 90 of the ballpoint switch 78. Consequently, when the pen 10 is held in a vertical or writing position, then the metal slug or pellet 104, owing to its weight, simply rests on the contacts 88, 90. However, when the pen 10 is inverted, then the slug or pellet 104 shifts so that it bridges or closes the normally open contacts 100, 102 on the underside of the upper disc 98 to supply a reset or clear signal to the counter 74 can be appreciated from the phantom line position of the slug or pellet 104 in FIG. 3.

Figure 3:
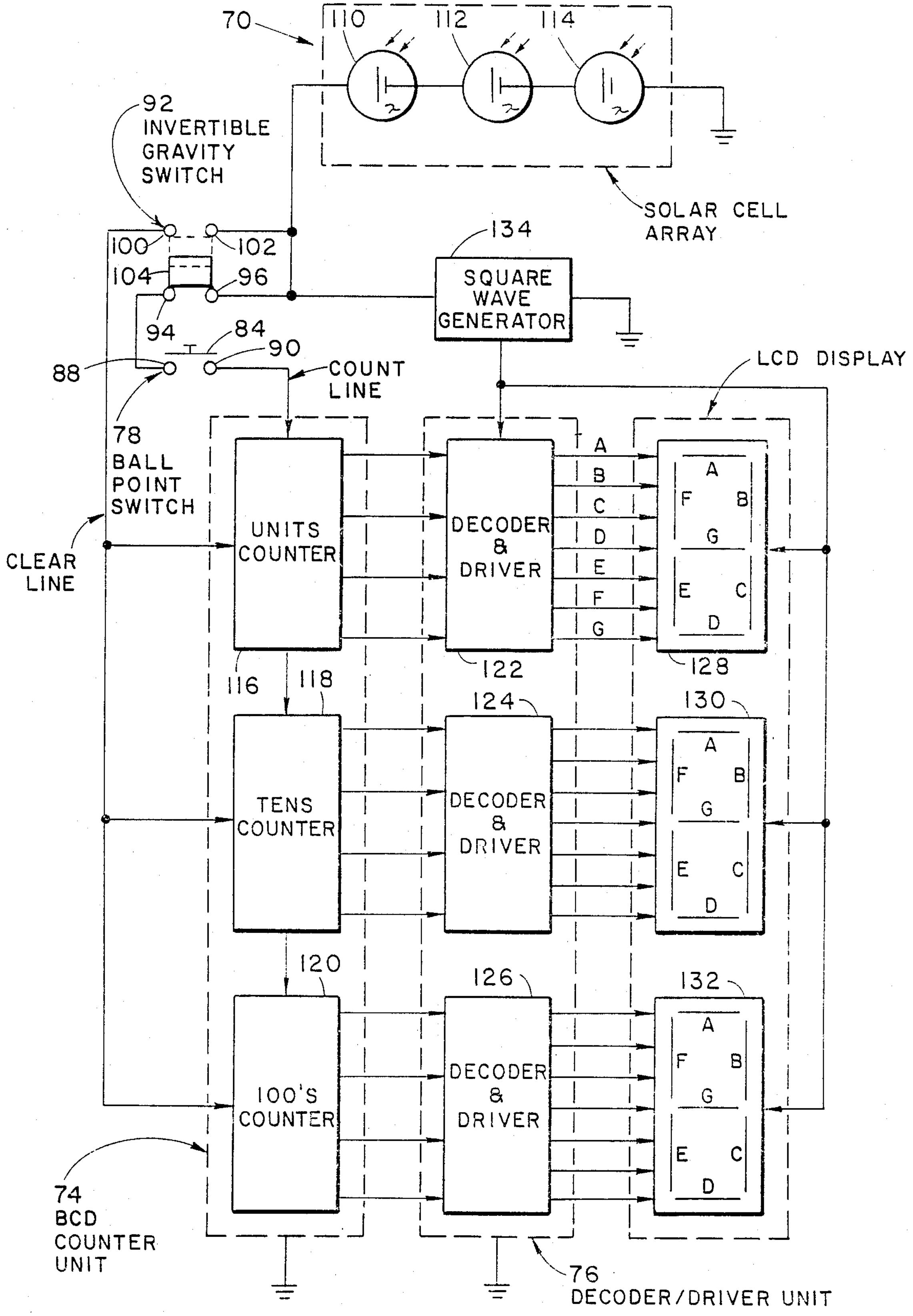
FIG. 3 is a combined schematic and block diagram of the electronic circuitry contained in the pen depicting our invention.

Referring now in detail to FIG. 3, it will be discerned that the solar cell array 70 comprises three photovoltaic cells 110, 112 and 114, these cells being connected in series. It will also be seen from FIG. 3 that the counter 74 comprises in this instance three decimal or BCD counting stages 116, 118 and 120. These counting stages 116, 118 and 120 are cascaded so as to count the pulses derived from the ballpoint switch 78, providing a displayed count from "0" to "999" inasmuch as the stage 116 constitutes a units counting stage, the stage 118 a tens counting stage and the stage 120 a hundreds counting stage. Since decimal or BCD counters of this type are well known, the extact construction or makeup of the stages 116, 118 and 120 need not be dealt with herein. It should be recognized, though, that each stage forwards a 4-bit word to the various decoder and driver sections contained in the decoder/driver unit 76.

It will be recognized that the decoder/driver unit 76 is composed of individual circuits 122, 124 and 126, each capable of converting the 4-bit word it receives from the counter stage 116, 118 or 120, as the case may be, to 7 bits needed to control the various segments of the LCD display 72. The LCD display 72 is comprised in this instance of three single-digit liquid-crystal indication devices which are identified by the reference numerals 128, 130 and 132. It will be understood that the LCD drive circuits within the driver portion of the decoder/driver unit 76 involve exclusive-OR (XOR) gates so as to interface the decoder section to the display 72 via the driver portion. Although the various gates contained in the decoder need not be shown, it will be recognized that by means of a square wave generator 134, a series of positive pulses are constantly applied to the backplane of each of the LCD devices 128, 130 and 132. Simultaneously, the square wave drive signal is applied to one input of each of the XOR gates contained within the decoder portion of the decoder/driver 76. The other gate inputs, to be consistent of course, are controlled by the 7 segment decoder values that are converted from the BCD signals forwarded from the various counting stages 116, 118 and 120 belonging to the counter 74. Although the display 74 is capable of displaying a number as large as 999, it is highly unlikely that an examination will have that many questions and answers. However, as far as inventory taking is concerned, it may be very well develop that all three devices 128, 130 and 132 will be activated.

Solely for the sake of discussion, it can be assumed that an examination has 100 questions and that the tally or total count of the counter 74 is "72", signifying that there are 72 correct answers. The device 128 will, therefore, display the numeral "7" and the device 130 will display the numeral "2". Under these circumstances, the device 132 will remain inactivated. More specifically, the segments A, B and C of the device 128 will be activated, whereas the segments A, B, G, E and D of the device 130 will be activated.

All that need be understood is that noninverted waveforms are applied to the backplanes of the devices 128, 130 (and also 132) but that inverted waveforms are applied to the segments A, B and C of the device 128 and segments A, B, G, E and D of the device 130. To all of the other segments of the devices 128 and 130, as well as all of the segments of the device 132, there will be no phase shift. Since the pulses are of the same polarity as those applied to the backplane of the three devices 128, 130 and 132, the segments not participating in the numerical readout will simply remain inactivated because of the same polarity being applied to the backplane and the segments that are not to be lighted.

Having presented the foregoing description, portions thereof having already dealt with the manner in which our writing implement 10 functions, it is believed that the benefits to be derived from a practicing of our invention will, for the most part, already have been recognized. Nonetheless, a brief resume of what occurs will perhaps be useful in assuring that there is a complete appreciation of what can be achieved with the illustrated ballpoint pen 10. An arbitrary readout or count "72" has already been mentioned. This simply means that the pen 10 has been pressed downwardly against the writing medium (not shown) 72 times. It has been assumed that the examination consists of 100 questions and the "72" count would signify a score of 72 out of a possible 100 correct answers. Each time that the teacher, assuming that the pen 10 is being used by a teacher for grading purposes, is pressed downwardly to provide, say, a check mark (although a count could be made of the incorrect answers), the ball 52 is pressed or forced upwardly, causing the upper end of the reservoir or refill cartridge 40 to bear against the underside of the resilient diaphragm 80, urging the diaphragm 80 upwardly so that the metal wafer 84 electrically bridges the contacts 88, 90 on the underside of the fixedly disposed disc 86. What should be appreciated, though, is that the mounting of the disc 86 in a rigid manner prevents any appreciable upward movement of the diaphragm 80 and the disc 82 carried thereon. Only a few thousandths of an inch movement is needed to complete the circuit and, once completed, any further movement is restricted by reason of the engagement of the wafer 84 with the contacts 88, 90. The phantom position of the collar 46 on the plastic tube 42, even though exaggerated, will indicate, at least to some degree, the upward movement of the replaceable reservoir or refill cartridge 40 that effects the closing of the contacts 88, 90 to complete a circuit through the contacts 94, 96 so as to register the first count. Stated somewhat differently, there is an electrical path completed from the photovoltaic cell 110 of the serially connected cells 110, 112 and 114 of the solar cell array 70 to the input of the counting stage 116. This count will be immediately converted to a 4-bit word that is then processed by the decoder/-driver 122 so as to activate the segments B and C of the device 128.

When the user of the pen 10 relaxes his or her dowwnard pressure, the elastomeric washer 54, acting against the ears or tabs 44 on the plastic tube 42, breaks the circuit, since the washer 54, having been flexed upwardly, gently urges the entire cartridge 40 downwardly with the consequence that the elastomeric diaphragm 10 returns to its unflexed condition which is shown in FIG. 2. It is obvious that the pair of contacts 88, 90 are no longer bridged by the wafer 84 with the consequence that the circuit is interrupted and is readied for the next count.

Assuming that the count "72" is reached and that the teacher wishes to clear the reading that has appeared on the display 72, the presence of the gravity switch 92 enables the teacher to only invert the pen 10 so that the slug or pellet 104 shifts from the solid line position shown in FIGS. 2 and 3 to the dotted line position shown in FIG. 3. This energizes the reset or clear line leading to the several counting stages 116, 118 and 120 of the counter 74 which in turn deactivates the segments of the devices 128 and 130 so that nothing is displayed until the pen 10 is again pressed against the writing medium, in this case, the answer sheet.

It should be recognized that if one wishes to use the pen 10 in a conventional fashion, he or she is free to do so because the disc 86, being fixedly disposed, blocks any appreciable upward movement of the reservoir or refill cartridge 40 so that the user can simply write in the customary manner if he or she so wishes. The several thousandths movement, which is all that is needed to actuate the switch 78, makes it such that the user is virtually unaware that he or she is using a ballpoint pen differing in construction from a conventional one. Prior art pens of purely the mechanical linkage-type require an appreciable ball movement in order to produce a registration and would be quite objectionable if one were to use such a pen for general writing.

We claim:

1. A writing instrument capable of counting the number of marks made therewith comprising housing means, a movable marking element normally projecting from said housing means, a switch in said housing means actuatable by movement of said marking element, resettable electronic counting means contained in said housing means for counting the number of times said switch is actuated by said marking element, means operated by said counting means for displaying the counting number of times said switch is actuated by said marking element, means for energizing said electronic counting means and said display means, and gravity switch means contained in said housing means for resetting said electronic counting means.

2. A writing instrument in accordance with claim 1 in which said gravity switch means includes a shiftable metal pellet, first switch contacts normally bridged by said pellet when said writing instrument is in a writing position to connect said energizing means to said counting means, and second switch contacts bridged by said pellet when said writing instrument is inverted to cause said energizing means to reset said counting means.

3. A writing instrument in accordance with claim 2 in which said first switch contacts are in series with said energizing means and the switch actuatable by said marking element.

4. A writing instrument in accordance with claim 3 including a clear line for said counting means, said second switch contacts being in series with said energizing means and said clear line.

5. A writing instrument in accordance with claim 4 in which said energizing means includes a plurality of serially connected photovoltaic cells, said photovoltaic cells being connected in series with said first contacts and said counting means when said first contacts are bridged by said pellet, and said photovoltaic cells being connected in series with said clear line when said second contacts are bridged by said pellet.

* * * * *